United States Patent
Mertens et al.

(10) Patent No.: US 10,320,185 B2
(45) Date of Patent: Jun. 11, 2019

(54) INTEGRATED CIRCUIT WITH PROTECTION FROM TRANSIENT ELECTRICAL STRESS EVENTS AND METHOD THEREFOR

(71) Applicant: FREESCALE SEMICONDUCTOR, INC., Austin, TX (US)

(72) Inventors: Robert Matthew Mertens, Austin, TX (US); Alexander Paul Gerdemann, Austin, TX (US); Michael A. Stockinger, Austin, TX (US)

(73) Assignee: NXP USA, Inc., Austin, TX (US)

( * ) Notice: Subject to any disclaimer, the term of this patent is extended or adjusted under 35 U.S.C. 154(b) by 289 days.

(21) Appl. No.: 15/273,223

(22) Filed: Sep. 22, 2016

(65) Prior Publication Data

US 2018/0083443 A1    Mar. 22, 2018

(51) Int. Cl.
| H02H 9/00 | (2006.01) |
| H02H 9/04 | (2006.01) |
| H03K 17/0812 | (2006.01) |
| H01L 27/02 | (2006.01) |
| H02H 3/22 | (2006.01) |

(52) U.S. Cl.
CPC ......... H02H 9/046 (2013.01); H01L 27/0285 (2013.01); H03K 17/08122 (2013.01)

(58) Field of Classification Search
CPC ................ H02H 9/046; H01L 27/0285; H03K 17/08122
USPC .................................................... 361/56, 111
See application file for complete search history.

(56) References Cited

U.S. PATENT DOCUMENTS

| 6,970,336 | B2 | 11/2005 | Stockinger et al. |
| 7,274,546 | B2 * | 9/2007 | Gauthier, Jr. .......... H02H 9/046 361/56 |
| 7,372,679 | B1 | 5/2008 | Ho et al. |
| 8,456,784 | B2 | 6/2013 | Stockinger et al. |
| 8,654,492 | B2 * | 2/2014 | Yeh ..................... H01L 27/0285 361/56 |
| 9,438,030 | B2 | 9/2016 | Stockinger et al. |
| 2004/0136126 | A1 * | 7/2004 | Smith ................. H01L 27/0251 361/56 |
| 2007/0188953 | A1 | 8/2007 | Lee et al. |
| 2011/0299202 | A1 * | 12/2011 | Cai ........................ H02H 9/046 361/56 |
| 2013/0222954 | A1 | 8/2013 | Demange |

FOREIGN PATENT DOCUMENTS

| DE | 10 2008 001368 A1 | 10/2009 |
| WO | WO-2006/053337 A2 | 5/2006 |

* cited by examiner

*Primary Examiner* — Thienvu V Tran
*Assistant Examiner* — Lucy M Thomas

(57) ABSTRACT

An integrated circuit for protecting against transient electrical stress events includes a rail clamp device, and a trigger circuit including a resistive-capacitive (RC) filter, a drive circuit including a first inverter stage receiving an input signal from the RC filter, the drive circuit is configured to enable the rail clamp device during a transient electrical stress event, and a stress event detection circuit coupled to the RC filter. The drive circuit includes a configurable activation voltage which is controlled by the stress event detection circuit, wherein the activation voltage is reduced when the transient electrical stress event is detected.

12 Claims, 3 Drawing Sheets

INTEGRATED CIRCUIT WITH PROTECTION FROM TRANSIENT ELECTRICAL STRESS EVENTS AND METHOD THEREFOR

BACKGROUND

Field

This disclosure relates generally to integrated circuits (ICs), and more specifically, to protection from transient electrical stress (TES) events for integrated circuits.

Related Art

Electronic circuits are designed to operate over limited voltage ranges. Exposure to voltages beyond those limited voltage ranges can damage or destroy those circuits. The problem is particularly notable for integrated circuits, which often have many external terminals connected to circuitry fabricated on a very small scale.

While transient voltage suppression circuits for integrated circuits exist, they tend not to function well for both unpowered transient events (i.e., those transient events occurring when the integrated circuit is not powered up for normal operation) and powered transient events (i.e., those transient events occurring when power is applied to the integrated circuit for normal operation). Unpowered TES events may include, but are not limited to, Electrostatic Discharge events (ESD), for example Human Body Model (HBM), Machine Model, or Charged Device Model (CDM) events. Powered TES events may include, but are not limited to, Powered ESD (PESD), Electric Fast Transient (EFT), Power Surge, or Ring Wave events.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
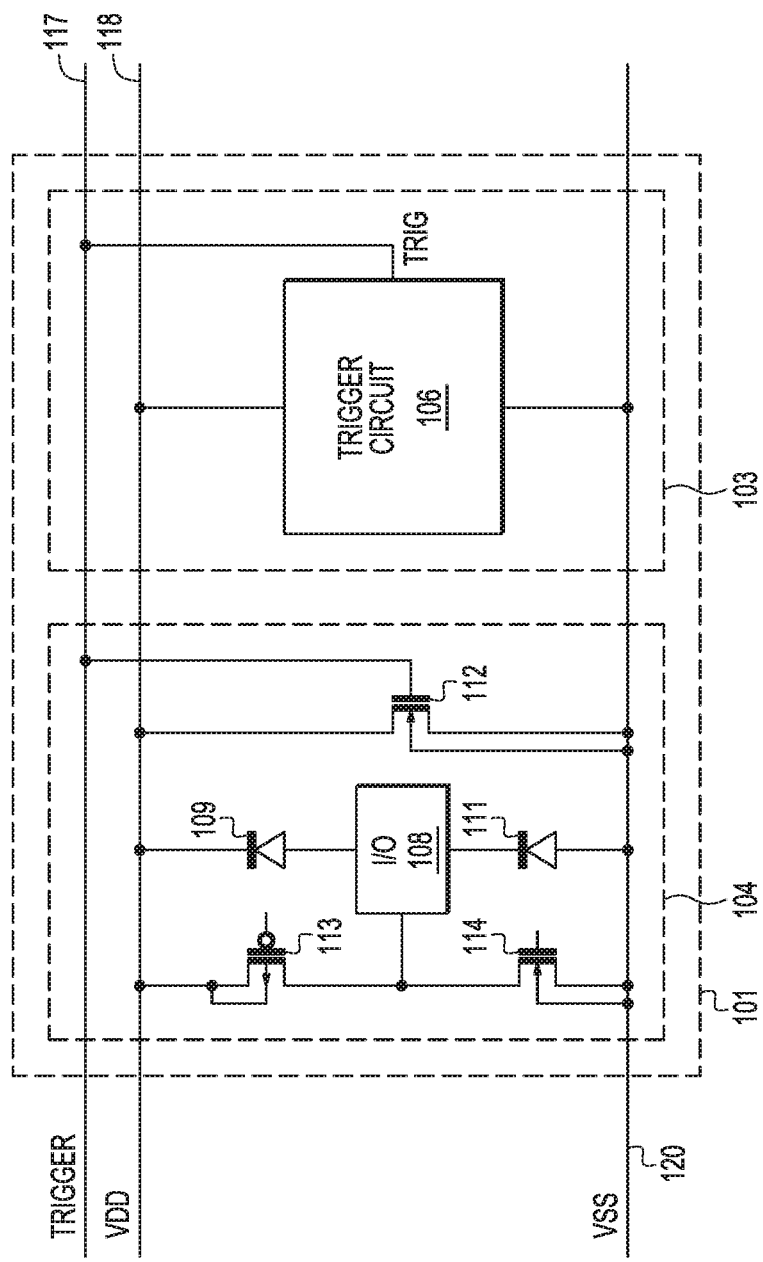
FIG. 1 illustrates, in partial schematic and partial block diagram form, an integrated circuit having TES event protection circuitry, in accordance with one embodiment of the present invention.

A transient electrical stress (TES) event refers to a fast rise in voltage at a net inside an electronic circuit which may result in damage or destruction of electronic circuits coupled to that net. Therefore, with TES event protection circuitry, a trigger circuit detects a transient voltage increase corresponding to a TES event, and, in response, places a clamping device into a conductive state to provide a current path to safely dissipate the associated stress current and to limit the transient voltage during the TES event. Typically, a large MOS device is used as the clamping device with the conductivity of the large MOS device controlled by the trigger circuit. In many cases, an array of large MOS clamping devices is used with their gate terminals biased by a shared trigger circuit. During a TES event, it is desirable that the MOS clamping device does not reach its breakdown voltage as this may lead to the destruction of the clamping device and therefore cause permanent damage to the electronic circuit. However, in some applications, the normal operating voltage and the breakdown voltage of the MOS clamping device are very close, thus the design margins for the trigger circuit activating before the MOS device goes into breakdown is very tight, limiting the ability of the MOS device to operate as a clamping device for powered TES events (TES events in which the circuit is powered up by the operating supply voltage). Therefore, as will be described below, a trigger circuit with a reduced activation voltage is used which will, for example, result in activation of the MOS clamping device before the breakdown voltage is reached. Furthermore, even if the activation margin is sufficiently large, due, for example, to a higher breakdown voltage, a lower activation voltage may be desired to reduce the stress voltage on circuit nets and thereby protect delicate devices coupled to these circuit nets, which may include, for example, input/output (I/O) pads or supply pads.

The trigger circuits described in FIGS. 2 and 3 below each include a high pass resistor-capacitor (RC) filter, a stress event detection circuit, an activation voltage adjuster, and a main drive circuit. The detection circuit detects an overvoltage condition on a supply rail, such as VDD, and provides inputs to the activation voltage adjuster circuit. The activation voltage adjuster circuit operates to lower the activation voltage of the main drive circuit during a TES event. The main drive circuit, with the inputs received from the RC filter and the activation voltage adjuster circuit, controls the conductivity of a clamp device by controlling the gate voltage of the clamp. In a typical trigger circuit for powered TES event protection, the main drive circuit design may be optimized for overall stability (i.e. avoiding unwanted oscillation of the protection network), and the native activation voltage of the main drive circuit (which also serves as the stress event detector in this case) may therefore be relatively high. By separating the stress event detection function from the main drive circuit, each of the trigger circuit components (the main drive circuit and the stress event detector) can be optimized separately for the trigger circuit's particular need, such as balancing the activation voltage with the trigger circuit's stability.

FIG. 1 illustrates, in partial schematic and partial block diagram form, an integrated circuit 100 having TES event protection circuitry. IC 100 includes an input/output (I/O) module 104, a trigger circuit 106, and a rail clamp device 112. IC 100 also includes a plurality of voltage rails and signaling buses, including, for example, a positive voltage rail VDD 118, a negative voltage rail VSS 120, and a trigger bus TRIGGER 117. Positive voltage rail VDD 118 and negative voltage rail VSS 120 provide power to system components protected by rail clamp device 112 and trigger circuit 106 for the usual operation of such system components, with negative voltage rail VSS 120 generally thought of as a ground reference potential with respect to which other voltages are referenced. Signaling bus TRIGGER 117 receives a trigger signal TRIG from trigger circuit 106 and provides that trigger signal TRIG to I/O module 104.

I/O module 104 includes I/O pad 108, diode 109, diode 111, rail clamp device 112, pull-up output driver 113, and pull-down output driver 114. I/O pad 108 provides a conductive connection for an external terminal (e.g., pin, ball, bump, land, or the like) of IC 100. Diodes 109 and 111 provide paths for currents to maintain voltage relationships between nodes or buses based on the current-voltage (I-V) curves of diodes 109 and 111. If the I/Os are switching within a range between negative voltage rail VSS 120 and positive voltage rail VDD 118 (e.g., during normal chip operation), the diodes 109 and 111 remain in a non-conductive state. Diode 109 passes current between I/O pad 108 and positive voltage rail VDD 118 when a positive voltage overstress event is applied to I/O pad 108. For example, when the voltage at I/O pad 108 rises to more than one diode forward voltage drop above the voltage of positive voltage rail VDD 118, diode 109 will conduct. Diode 111 provides a current path from negative voltage rail VSS 120 to I/O pad 108 when a negative voltage overstress event is applied to I/O pad 108. For example, when the voltage at I/O pad 108 falls to more than one diode forward voltage drop below the voltage of negative voltage rail VSS 120, diode 111 will conduct. In that manner, diodes 109 and 111 protect I/O pad 108 from overstress events by limiting the voltage on I/O pad 108 to within a diode forward voltage drop above VDD 118 or below VSS 120. Clamping device 112, which may, for example, be an N-channel metal oxide semiconductor field effect transistor (MOSFET or MOS transistor), has a first terminal (e.g., a drain terminal) coupled to VDD 118, a second terminal (e.g., a source terminal) coupled to VSS 120, a control terminal (e.g., a gate terminal) coupled to TRIGGER 117, and a body terminal coupled to VSS 120. Pull-up output driver 113, which may, for example, be a P-channel MOSFET, has a first terminal (e.g., a source terminal) coupled to VDD 118, a second terminal (e.g., a drain terminal) coupled to I/O pad 108, a control terminal (e.g., a gate terminal) coupled to an output pre-driver circuit for causing pull-up output driver 113 to drive I/O pad 108 to a high logic level, and a body terminal coupled to the first terminal of driver 113. Pull-down output driver 114, which may, for example, be an N-channel MOSFET, has a first terminal (e.g., a drain terminal) coupled to I/O pad 108, a second terminal (e.g., a source terminal) coupled to VSS 120, a control terminal (e.g., a gate terminal) coupled to the output pre-driver circuit for causing pull-down output driver 114 to drive I/O pad 108 to a low logic level, and a body terminal coupled to negative voltage rail VSS 120.

Still referring to FIG. 1, trigger circuit block 106 is coupled to VDD 118 and VSS 120, and a trigger output of trigger circuit block 106 is coupled to TRIGGER 117. As an example, trigger circuit 106 may be applied to pad ring scenarios, such as where multiple I/O pads 108 can share one trigger circuit. For example, a trigger circuit such as trigger circuit 106 may be placed with a certain ratio of I/O modules 104 to trigger circuits (e.g., 8:1).

Figure 2:
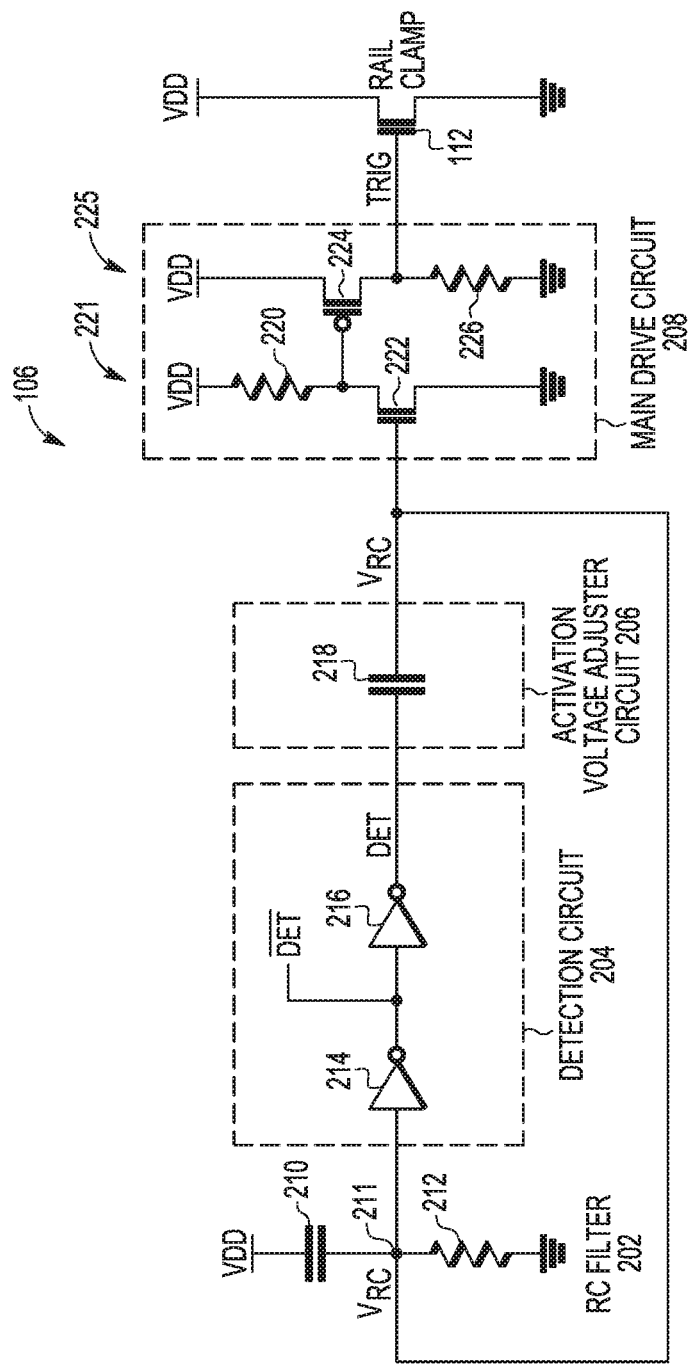
FIG. 2 illustrates, in schematic form, one embodiment of a trigger circuit of TES event protection circuitry of FIG. 1.

FIG. 2 illustrates, in schematic form, one embodiment of trigger circuit 106 of FIG. 1. In the embodiment of FIG. 2, trigger circuit 106 includes a high pass RC filter 202, a stress event detection circuit 204, an activation voltage adjuster circuit 206, and a main drive circuit 208. Also included in FIG. 2 is rail clamp device 112. High pass RC filter 202 includes a capacitive element 210 coupled in series with a resistive element 212. Capacitive element 210 has a first terminal coupled to a first voltage supply terminal, which may be coupled to VDD 118, and a second terminal coupled to a circuit node 211. Resistive element 212 has a first terminal coupled to node 211 and a second terminal coupled to a second voltage supply terminal, which may be coupled to VSS 120. The voltage at node 211 corresponds to $V_{RC}$. Detection circuit 204 includes cascaded inverters 214 and 216. An input of inverter 214, corresponding to an input of detection circuit 204, is coupled to RC filter 202 at node 211. An input of inverter 216 is coupled to an output of inverter 214, and an output of inverter 216 provides an output of detection circuit 204, referred to as DET, which indicates whether a TES event has been detected. The output of inverter 214 provides DETb (which is denoted on FIG. 2 as DET with a bar over it). Activation voltage adjuster circuit 206 includes a capacitive element 218 having a first terminal coupled to the output of detection circuit 204 and a second terminal coupled to RC filter 202 at node 211 and coupled to an input of main drive circuit 208.

Main drive circuit 208 includes an inverter stage 221 cascaded with an inverter stage 225. An input of inverter stage 221 corresponds to an input of drive circuit 208, and is coupled to RC timer 202 and to activation voltage adjuster circuit 206 at node 211. An input of inverter stage 225 is coupled to an output of inverter stage 221, and an output of inverter stage 225 provides an output of drive circuit 208. The output of drive circuit 208 provides the signal TRIG which controls operations of rail clamp 112. Inverter stage 221 includes a ballast element 220, shown in the form of a resistor, having a first terminal coupled to the first supply voltage, which may also be coupled to VDD 118. Inverter stage 221 also includes an N-channel MOS transistor 222 having a first current electrode coupled to the second terminal of ballast element 220, a second current electrode coupled to the second supply voltage, which may also be coupled to VSS 120, and a control electrode coupled to node 211 and the output of activation voltage adjuster circuit 206. The control electrode of device 222 corresponds to the input of inverter stage 221, and the first current electrode of device 222 corresponds to the output of inverter stage 221. Inverter stage 225 includes a P-channel MOS transistor 224 having a first current electrode coupled to the first supply voltage (which may also be coupled to VDD 118), a control electrode coupled to the first current electrode of device 222 (i.e. the output of inverter stage 221), and a second current electrode coupled to provide TRIG to a gate electrode of clamp device 112. Inverter stage 225 also includes a ballast element 226, shown in the form of a resistor, having a first terminal coupled to the second current electrode of device 222 and a second terminal coupled to the second supply voltage (which may also be coupled to VSS 120). The control electrode of device 224 corresponds to the input of inverter stage 225, and the second current electrode of device 222 corresponds to the output of inverter stage 225. The control electrode of clamp device 112 is coupled to trigger circuit 106 at the output of main drive circuit 208. The first current electrode of device 112 is coupled to the first supply voltage and the second current electrode of device 112 is coupled to the second supply voltage.

In operation (i.e. when the first supply voltage is powered up), upon occurrence of a TES event, clamp device 112 is turned on. When a TES event occurs, $V_{RC}$ at node 211 rises due to the coupling of node 211 to the first supply voltage via capacitive element 210, and when the switching point of inverter 214 is reached, the output (DETb) of inverter 214 goes low and thus the output (DET) of inverter 216 goes high. Therefore, DET is asserted indicating a TES event has been detected (and indicating that an over-voltage condition on the first supply voltage has occurred). RC filter 202 ensures that sharp ramps on the first supply voltage activate detection circuit 204 and assert DET. That is, RC filter 202 helps to discriminate between a normal rise in supply voltage versus a fast stress event that is not normal, and which can result in damage of the electronic circuits coupled to VDD 118. Upon occurrence of a TES event, current is provided to capacitive element 218 of activation voltage adjuster circuit 206. Detection circuit 204 and activation voltage adjuster circuit 206 provide a positive feedback mechanism such that the charge that gets stored onto capacitive element 218 when DET is asserted (i.e. the DET node is switched from VSS to VDD) reduces the charge on capacitive element 210 and thus increasing the input voltage to drive circuit 208. This results in lowering the effective activation threshold voltage of device 222, and thus of inverter stage 221. Once $V_{RC}$ triggers inverter stage 221, the output of inverter stage 225 goes high to activate clamp device 112. In this manner, clamp device 112 is activated during a TES event.

The reduction of the charge on capacitive element 210 with activation voltage adjuster circuit 206 ensures that main drive circuit 208 is activated appropriately, such as before the breakdown voltage of clamp device 112 is reached. In this manner, even with small margins between the operating supply voltage and the breakdown voltage of device 112 due, for example, to a relatively high supply voltage or a relatively low breakdown voltage, detection circuit 204 is activated first which then results in activation of main drive circuit 208. Therefore, detection circuit 204 and activation voltage adjuster circuit 206 operate to temporarily lower the activation voltage of main drive circuit 208, and thus of trigger circuit 106, during a detected TES event. Note that while a TES event is not occurring, $V_{RC}$ and DET remain low and thus clamp device 112 is not activated (is maintained in a non-conductive state).

Figure 3:
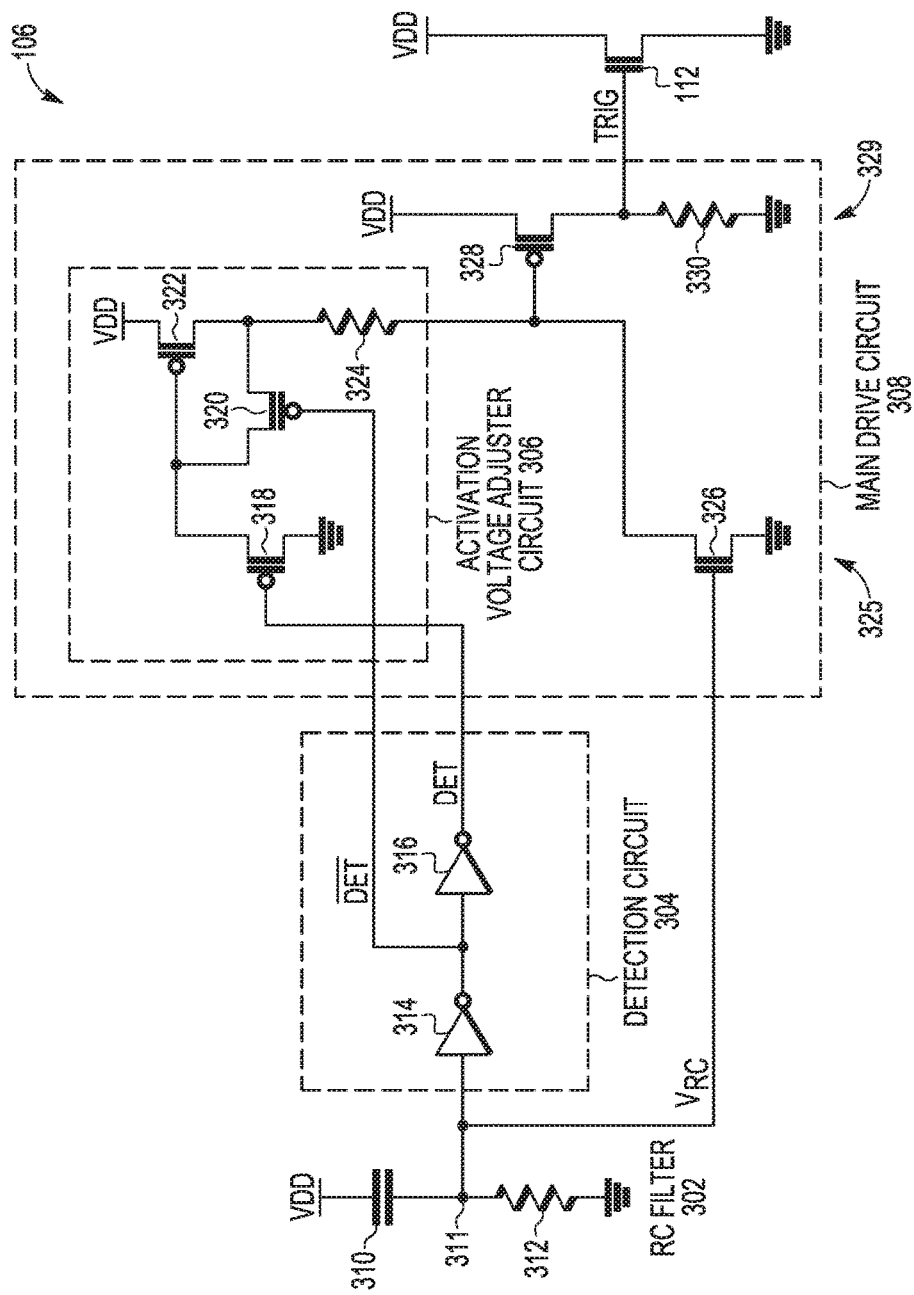
FIG. 3 illustrates, in schematic form, another embodiment of a trigger circuit of the TES event protection circuitry of FIG. 1.

FIG. 3 illustrates, in schematic form, another embodiment of trigger circuit 106 of FIG. 1. In the embodiment of FIG. 3, trigger circuit 106 includes a high pass RC filter 302, a stress event detection circuit 304, an activation voltage adjuster circuit 306, and a main drive circuit 308. Also included in FIG. 3 is rail clamp device 112. Note that activation voltage adjuster circuit 306, as illustrated in FIG. 3, may be part of main drive circuit 308. High pass RC filter 302 includes a capacitive element 310 coupled in series with a resistive element 312. Capacitive element 312 has a first terminal coupled to a first voltage supply terminal, which may be coupled to VDD 118, and a second terminal coupled to a circuit node 311. Resistive element 312 has a first terminal coupled to node 311 and a second terminal coupled to a second voltage supply terminal, which may be coupled to VSS 120. The voltage at node 311 corresponds to $V_{RC}$. Note that all the descriptions and alternatives described above in reference to RC filter 202 also apply to RC filter 302. Detection circuit 304 includes cascaded inverters 314 and 316. An input of inverter 314, corresponding to an input of detection circuit 304, is coupled to RC filter 302 at node 311. An input of inverter 316 is coupled to an output (DETb) of inverter 314, and an output (DET) of inverter 316 provides an output of detection circuit 304, referred to as DET, which indicates whether a TES event has been detected. The output of inverter 314 provides another output of detection circuit 304, DETb (which is denoted on FIG. 3 as DET with a bar over it).

Activation voltage adjuster circuit 306 includes P-channel MOS transistors 318, 320, and 322. A first current electrode of device 322 is coupled to a first supply voltage, which may be VDD 118. A first current electrode of device 318 is coupled to a control electrode of device 322, a second current electrode is coupled to a second supply voltage, which may be VSS 120, and a control electrode is coupled to the output of inverter 316 to receive DET. A first current electrode of device 320 is coupled to the control electrode of device 322 and a control electrode is coupled to the output of inverter 314 to receive DETb. Main drive circuit 308 includes activation voltage adjuster circuit 306, and an inverter stage 325 cascaded with an inverter stage 329. Inverter stage 325 includes a ballast element 324, shown in the form of a resistor, having a first terminal coupled to a second current electrode of device 322 and to a second current electrode of device 320. Inverter stage 325 also includes an N-channel transistor 326 having a first current electrode coupled to a second terminal of ballast element 324, a second current electrode coupled to the second supply voltage, and a control electrode coupled to node 311, which corresponds to $V_{RC}$. The control electrode of device 326 corresponds to an input of inverter stage 325 and the first current electrode of device 326 corresponds to an output of inverter stage 325. Inverter stage 329 includes a P-channel transistor 328 having a first current electrode coupled to the first supply voltage, and a control electrode coupled to the second terminal of ballast element 324. Inverter stage 329 also includes ballast element 330, shown in the form of a resistor, having a first terminal coupled to a second current electrode of device 328 and second terminal coupled to the second supply voltage. The control electrode of device 328 corresponds to an input of inverter stage 329 and the second current electrode corresponds to an output of inverter stage 329. The output of inverter stage 329 is coupled to provide TRIG to the control electrode of clamp device 112.

In operation (i.e. when the first supply voltage is powered up), upon occurrence of a TES event, clamp device 112 is turned on. When a TES event occurs, $V_{RC}$ at node 311 rises due to the coupling of node 311 to the first supply voltage via capacitive element 310, and when the switching point of inverter 314 is reached, the output of inverter 314 (DETb) goes low and thus the output of inverter 316 (DET) goes high. Therefore, DET is asserted indicating a TES event has been detected (and indicating an over-voltage condition on the first supply voltage has occurred). Therefore, during a TES event, DET is high and DETb is low, and when a TES event is not occurring, DET is low and DETb is high. When a TES event is not occurring, the control electrode of device 322 is pulled low by device 318 and is turned on to allow inverter stage 325 to operate without being affected by device 322. However, during a TES event, device 318 is turned off and device 320 is turned on, which switches the control electrode of device 322 onto the second current electrode of device 322. Device 322 is selected to be a relatively wide device such that when the control electrode (i.e. gate) and the second current electrode (i.e. drain) of device 322 are connected, device 322 acts as a voltage source inserted between the first terminal of ballast element 324 and the first supply voltage. This additional voltage source lowers the input voltage of inverter stage 329 (which is at VDD level during normal chip operation, i.e. when a TES event is not occurring) by approximately a MOS threshold voltage drop which results in reducing the activation voltage of inverter stage 329 and thus of trigger circuit 106. Once $V_{RC}$ triggers inverter stage 325, the output of inverter stage 325 goes low and the output of inverter stage 329 goes high to activate clamp device 112. In this manner, clamp device 112 is activated during a TES event. Therefore, as in the trigger circuit of FIG. 2, detection circuit 304 and activation voltage adjuster circuit 306 operate to temporarily lower the activation voltage of main drive circuit 308, and thus of trigger circuit 106, during a detected TES event.

The lowering of the activation voltage ensures that main drive circuit 308 is activated appropriately, such as before the breakdown voltage of clamp device 112 is reached. In this manner, even with small margins between voltage supply and breakdown voltage of device 112 due, for example, to a relatively high supply voltage or a relatively low breakdown voltage, detection circuit 304 is activated first which then results in activation of main drive circuit 308.

Trigger circuit 106 is useful for powered TES protection, in which the first voltage supply, VDD, provides power to IC 100. During unpowered TES events, and referring to FIG. 2, inverter stages 221 and 225 operate as digital logic gates, regardless of the presence of detection circuit 204 and activation voltage adjuster circuit 206. However, during a powered TES event, inverter stages 221 and 225 operate as a high-gain amplifier effectively regulating the conductive state of clamp device 112 so as to limit the voltage rise of the first supply voltage. This also applies to inverter stages 325 and 329 of FIG. 3. Also, by lowering the effective trigger voltage of devices 222 or 328 with activation voltage adjuster circuit 206 or 306, ballast element 220 of inverter stage 221 and ballast element 324 of inverter stage 325 can be designed with a relatively low resistance to ensure stability of the negative feedback loop formed by the trigger circuit and clamp device (i.e. to avoid unwanted oscillations).

In alternate embodiments, different circuit elements or configuration may be used for trigger circuit 106 of FIG. 2 or FIG. 3. For example, resistive element 212 or 312 can be implemented with one or more resistive elements. In one embodiment, resistive element 212 or 312 can be implemented with a resistive ladder or resistive pull-down network with a programmable resistive value in which the resistance can be set depending on the operating state of IC 100. Also, in an alternate embodiment, the positions of capacitive element 210/310 and resistive element 212/312 can be reversed. In another alternate embodiment, a P-channel MOS device can be used as clamp device 112 rather than an N-channel MOS device. Alternate embodiments may also include a different number inverter stages (e.g. one or more) in either detection circuit 204/304 or main drive circuit 208/308. Also, different logic gates may be used to implement the logic function of detection circuit 204/304. Similarly, different circuit configurations or logic gates can be used to implement inverter stages 221 and 225 or inverter stages 325 and 329, in which the activation voltage of main drive circuit 208 or 308, respectively, is temporarily lowered by activation voltage adjuster circuit 206 or 306, respectively, during a TES event. While the ballast elements of inverter stages 221/225 and inverter stages 325/329 are shown as resistors in the embodiments of FIGS. 2 and 3, other devices may be used for the implementation of these inverter stages, such as, for example, complementary MOS transistors or other types of resistive elements.

By now it can be understood how the activation voltage of a trigger circuit can be reduced through the use of a detection circuit and an activation voltage adjuster circuit, in combination with a high pass RC filter and main drive circuit. By separating the detection circuit and the activation voltage adjuster circuit from the main drive circuit, a lower activation voltage can be achieved while stability of the trigger circuit can be maintained through the design of the main drive circuit. The use of a trigger circuit with a reduced activation voltage allows for the MOS clamp device to be activated before the breakdown voltage is reached, even when the activation margin is small. Regardless of the activation margin available, though, a lower activation voltage may allow for the further prevention of stress on I/O pads and thus protect delicate devices coupled to the I/O pads.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Those skilled in the art will recognize that boundaries between the functionality of the above described blocks and operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, a boost scheme with a boost bus may be used IC 100. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit for protecting against transient electrical stress events includes a rail clamp device; a trigger circuit including: a resistive-capacitive (RC) filter; a drive circuit including a first inverter stage configured to receive an input signal from the RC filter, and to enable the rail clamp device during a transient electrical stress event; a stress event detection circuit coupled to the RC filter; the drive circuit having a configurable activation voltage which is controlled by the stress event detection circuit, wherein the activation voltage is reduced when the transient electrical stress event is detected. In one aspect, the stress event detection circuit includes a first inverter cascaded with a second inverter, wherein an input to the first inverter is coupled between a resistor and a capacitor coupled in series in the RC filter, and an output of the second inverter is a detection signal that is provided to the first inverter stage of the drive circuit controlling the activation voltage. In a further aspect, the drive circuit includes a second inverter stage in cascade with the first inverter stage of the drive circuit, further wherein the first inverter stage of the drive circuit includes a control input coupled to the output of the second inverter of the stress event detection circuit, and the second inverter stage of the drive circuit includes an output coupled to operate the rail clamp device. In another aspect, the integrated circuit further includes an activation voltage adjustment circuit configured to generate an adjustment voltage to reduce the activation voltage when the transient electrical stress event is detected, wherein the activation voltage adjustment circuit includes: a first MOS transistor having a gate electrode coupled to a first output of the stress event detection circuit, a first current electrode coupled to a gate electrode of a second MOS transistor, and a second current electrode coupled to a first voltage supply net; the second MOS transistor further includes a first current electrode coupled to a second voltage supply and a second current electrode coupled to a first terminal of a ballast element in the drive circuit; a third MOS transistor having a gate electrode coupled to a second output of the stress event detection circuit, a first current electrode coupled to the gate electrode of the second MOS transistor, and a second current electrode coupled to the first terminal of the ballast element in the drive circuit. In yet another aspect, the first inverter stage of the drive circuit includes: a first MOS transistor with a gate electrode receiving an input signal from the RC filter, a first current electrode coupled to a first voltage supply, and a second current electrode coupled to an output of the first inverter stage of the drive circuit; a ballast element with a first terminal coupled to the second current electrode of the first MOS transistor and a second terminal; an activation voltage adjustment circuit having a second MOS transistor that is configured to insert an adjustment voltage between a second voltage supply and the second terminal of the ballast element when the transient electrical stress event is detected; the first MOS transistor is of a first polarity type and the second MOS transistor is of a second polarity type. In a further aspect, the second MOS transistor has a first current electrode coupled to the second voltage supply, a second current electrode coupled to the second terminal of the ballast element, and a gate electrode; the stress event detection circuit switches the gate electrode of the second MOS transistor onto its second current electrode when the transient electrical stress event is detected.

In another embodiment, an integrated circuit for protecting against transient electrical stress events, includes a rail clamp device; a trigger circuit including: a resistive capacitive (RC) filter including a first capacitive element coupled in series with a resistive element; a stress event detection circuit with an input coupled between the resistive element and the first capacitive element of the RC filter; a second capacitive element including a first terminal connected to an output of the stress event detection circuit and a second terminal coupled to an output of the RC filter; a drive circuit including an input connected to a second terminal of the second capacitive element, and an output coupled to operate the rail clamp device. In one aspect, the stress event detection circuit includes: a first inverter; and a second inverter cascaded with the first inverter, wherein the input to the stress event detection circuit is an input to the first inverter; the output of the stress event detection circuit is an output of the second inverter. In another aspect, the drive circuit includes a first inverter stage cascaded with a second inverter stage, further wherein the first inverter stage includes the input connected to the second terminal of the second capacitive element, and the second inverter includes the output coupled to operate the rail clamp device. In a further aspect, the first inverter stage includes a first ballast element having a first terminal coupled to a first voltage supply and a second terminal coupled to a first current electrode of a first MOS transistor of a first polarity type; a gate electrode of the first MOS transistor is coupled to the second terminal of the second capacitive element, and a second current electrode of the first MOS transistor is coupled to a second voltage supply. In yet a further aspect, the second inverter includes a second MOS transistor of a second polarity type having a first current electrode coupled to the first voltage supply, a gate electrode coupled to the first current electrode of the first MOS transistor, and a second current electrode coupled to a first terminal of a second ballast element; a second terminal of the second ballast element is coupled to the second voltage supply. In another aspect, during a transient electrical stress event, the second capacitive element lowers charge stored by the first capacitive element in the RC filter. In a further aspect, the second capacitive element reduces charge on the first capacitive element by 5 to 20 percent.

Yet another embodiment, a method for protecting against transient electrical stress events includes: detecting an overvoltage condition at a supply voltage coupled to a trigger circuit that includes a drive circuit, wherein the drive circuit is coupled to operate a rail clamp device; upon detecting the overvoltage condition, lowering an activation voltage of the drive circuit during the over-voltage condition. In one aspect, the method further includes detecting voltage at a gate of a transistor in the drive circuit to detect the over-voltage condition. In one aspect, the method further includes temporarily lowering the activation voltage of the drive circuit by placing a MOS transistor in conducting mode during the over-voltage condition, wherein the MOS transistor is coupled between a voltage supply and the drive circuit. In another aspect, the method further includes temporarily lowering the activation voltage of the drive circuit during the over-voltage condition by adding a biasing voltage at a gate electrode of a transistor in the drive circuit. In a further aspect, the gate electrode of the transistor in the drive circuit is coupled to a terminal of a capacitive element. In another aspect, the method further includes feeding back the input to the drive circuit to a resistive-capacitive filter. In yet another aspect, lowering charge stored by a first capacitive element in a RC filter during operation using a second capacitive element.

What is claimed is:
1. An integrated circuit for protecting against transient electrical stress events comprising:
 a rail clamp device;
 a trigger circuit including:
  a resistive-capacitive (RC) filter;
  a drive circuit including a first inverter stage configured to receive an input signal from the RC filter, and to enable the rail clamp device during a transient electrical stress event;
  a stress event detection circuit coupled to the RC filter;
  the drive circuit having a configurable activation voltage which is controlled by the stress event detection circuit, wherein the activation voltage is reduced when the transient electrical stress event is detected; and
 an activation voltage adjustment circuit configured to generate an adjustment voltage to reduce the activation voltage when the transient electrical stress event is detected, wherein the activation voltage adjustment circuit includes:

a first MOS transistor having a gate electrode coupled to a first output of the stress event detection circuit, a first current electrode coupled to a gate electrode of a second MOS transistor, and a second current electrode coupled to a first voltage supply net;

the second MOS transistor further includes a first current electrode coupled to a second voltage supply and a second current electrode coupled to a first terminal of a ballast element in the drive circuit;

a third MOS transistor having a gate electrode coupled to a second output of the stress event detection circuit, a first current electrode coupled to the gate electrode of the second MOS transistor, and a second current electrode coupled to the first terminal of the ballast element in the drive circuit.

2. The integrated circuit of claim 1 wherein
the stress event detection circuit includes a first inverter cascaded with a second inverter, wherein an input to the first inverter is coupled between a resistor and a capacitor coupled in series in the RC filter, and an output of the second inverter is a detection signal that is provided to the first inverter stage of the drive circuit controlling the activation voltage.

3. The integrated circuit of claim 2 wherein
the drive circuit includes a second inverter stage in cascade with the first inverter stage of the drive circuit, further wherein the first inverter stage of the drive circuit includes a control input coupled to the output of the second inverter of the stress event detection circuit, and the second inverter stage of the drive circuit includes an output coupled to operate the rail clamp device.

4. The integrated circuit of claim 1 wherein
the first inverter stage of the drive circuit comprises:
a first MOS transistor with a gate electrode receiving an input signal from the RC filter, a first current electrode coupled to a first voltage supply, and a second current electrode coupled to an output of the first inverter stage of the drive circuit;
a ballast element with a first terminal coupled to the second current electrode of the first MOS transistor and a second terminal;
an activation voltage adjustment circuit having a second MOS transistor that is configured to insert an adjustment voltage between a second voltage supply and the second terminal of the ballast element when the transient electrical stress event is detected;
the first MOS transistor is of a first polarity type and the second MOS transistor is of a second polarity type.

5. The integrated circuit of claim 4, wherein
the second MOS transistor has a first current electrode coupled to the second voltage supply, a second current electrode coupled to the second terminal of the ballast element, and a gate electrode;
the stress event detection circuit switches the gate electrode of the second MOS transistor onto its second current electrode when the transient electrical stress event is detected.

6. A method for protecting against transient electrical stress events comprising:
using a detection circuit, detecting an over-voltage condition at a supply voltage coupled to a trigger circuit that includes a drive circuit, wherein the drive circuit is coupled to operate a rail clamp device;
upon detecting the overvoltage condition, lowering an activation voltage of the drive circuit during the over-voltage condition with an activation voltage adjustment circuit which includes:
a first MOS transistor having a gate electrode coupled to a first output of the detection circuit, a first current electrode coupled to a gate electrode of a second MOS transistor, and a second current electrode coupled to a first voltage supply net;
the second MOS transistor further includes a first current electrode coupled to a second voltage supply and a second current electrode coupled to a first terminal of a ballast element in the drive circuit;
a third MOS transistor having a gate electrode coupled to a second output of the detection circuit, a first current electrode coupled to the gate electrode of the second MOS transistor, and a second current electrode coupled to the first terminal of the ballast element in the drive circuit.

7. The method of claim 6 further comprising:
detecting voltage at a gate of a transistor in the drive circuit to detect the over-voltage condition.

8. The method of claim 6 further comprising:
temporarily lowering the activation voltage of the drive circuit by placing a MOS transistor in conducting mode during the over-voltage condition, wherein the MOS transistor is coupled between a voltage supply and the drive circuit.

9. The method of claim 6 further comprising:
temporarily lowering the activation voltage of the drive circuit during the over-voltage condition by adding a biasing voltage at a gate electrode of a transistor in the drive circuit.

10. The method of claim 9 wherein the gate electrode of the transistor in the drive circuit is coupled to a terminal of a capacitive element.

11. The method of claim 7 further comprising:
feeding back the input to the drive circuit to a resistive-capacitive filter.

12. The method of claim 6 wherein:
lowering charge stored by a first capacitive element in a RC filter during operation using a second capacitive element.

* * * * *